United States Patent
Buyuktepe

(10) Patent No.: US 7,634,631 B2
(45) Date of Patent: Dec. 15, 2009

(54) METHOD AND SYSTEM FOR UPDATING NETWORK FLOW STATISTICS STORED IN AN EXTERNAL MEMORY

(75) Inventor: Hayrettin Buyuktepe, Kanata (CA)

(73) Assignee: Alcatel Lucent, Paris (FR)

(*) Notice: Subject to any disclaimer, the term of this patent is extended or adjusted under 35 U.S.C. 154(b) by 697 days.

(21) Appl. No.: 11/482,706

(22) Filed: Jul. 10, 2006

(65) Prior Publication Data

US 2008/0010428 A1 Jan. 10, 2008

(51) Int. Cl.
*G06F 13/00* (2006.01)
(52) U.S. Cl. .................................. 711/169; 708/233
(58) Field of Classification Search ............... None
See application file for complete search history.

(56) References Cited

U.S. PATENT DOCUMENTS 6,335,992 B1 * 1/2002 Bala et al. ..................... 385/17
7,017,021 B2 * 3/2006 Gupta et al. ................. 711/169

* cited by examiner

*Primary Examiner*—Reginald G Bragdon
*Assistant Examiner*—Thanh D Vo
(74) *Attorney, Agent, or Firm*—Kramer & Amado, P.C.

(57) ABSTRACT

A method for updating a current network flow statistic stored in a memory device, comprising: storing a first statistic and a first address corresponding to a location in the memory device in a first stage of a multiple stage delay pipeline; shifting the first statistic and the first address to successive stages of the pipeline during successive clock cycles; at a middle stage of the pipeline, sending a read signal to the memory device to read the current statistic from the location; at a last stage of the pipeline, receiving the current statistic from the memory device in response to the read signal, adding the first statistic to the current statistic to generate an updated statistic, and sending a write signal to the memory device to write the updated statistic to the location; and, if a second statistic for the first address is stored in the first stage of the pipeline while the first statistic is stored in any but the first and last stages of the pipeline, replacing the first statistic with a sum of the first and second statistics and not sending the read signal when the second statistic is shifted to the middle stage.

19 Claims, 6 Drawing Sheets

METHOD AND SYSTEM FOR UPDATING NETWORK FLOW STATISTICS STORED IN AN EXTERNAL MEMORY

FIELD OF THE INVENTION

This invention relates to the field of statistics collection for network devices, and more specifically, to a method and system for updating network flow statistics gathered by a processor and stored in a memory device external to the processor.

BACKGROUND OF THE INVENTION

Statistics collection is an important function performed by integrated circuits ("ICs") in various applications. In data networking applications, for example, statistics are essential for managing bandwidth and quality of service. These statistics typically include a number of packets, bytes, etc., in a network flow or data path. Maintaining and updating these statistics is a challenging task as network applications may demand statistics for thousands of flows at ever increasing traffic rates. To keep up with these demands, a rapid update cycle is required for each statistic.

In a network device such as a switch or router, a field programmable gate array ("FPGA") may be used for statistics collection. An FPGA is an IC that can be programmed in the field after manufacture. FPGAs typically contain programmable logic components and programmable interconnects. The programmable logic components can be programmed to duplicate the functionality of basic logic gates such as AND, OR, XOR, NOT or more complex combinatorial functions such as decoders or simple math functions. In most FPGAs, these programmable logic components (or logic blocks, in FPGA parlance) also include memory elements, which may be simple flip-flops, registers, or more complete blocks of memories. A hierarchy of programmable interconnects allows the logic blocks of an FPGA to be interconnected as needed by the system designer, somewhat like a one-chip programmable breadboard. These logic blocks and interconnects can be programmed after the manufacturing process by the customer/designer (hence the term "field programmable") so that the FPGA can perform whatever logical function is needed. In addition to an FPGA, statistics collection typically requires the use of one or more large memory devices external to the FPGA for storing the statistics. The memory device may be a random access memory ("RAM") device such as a quad data rate ("QDR" or "QDR™II") synchronous RAM ("SRAM") device or a reduced latency dynamic random access memory ("RLDRAM") device.

Now, the total round-trip delay (i.e., the time to read from a location in memory including internal synchronization) is a serious bottleneck in maintaining per-flow statistics at the rate of packet arrival at the network device. In order to speed up memory access for statistic updates, simple pipeline techniques can provide a partial solution. However, a limitation of simple pipeline techniques is apparent when multiple updates for a particular flow are required for a period of time that is shorter than the round-trip delay. In such a case, each statistic update requires the previous update to have been completed.

One solution to this problem is to separate each memory access by the total round-trip delay due to the random nature of packet arrivals. However, such a solution would cause a slow down in the speed of operation of the statistics system and would necessitate additional storage due to the slow down. Another solution is to separate the memory accesses for a given flow by the round-trip delay. However, this solution would only alleviate the problem to a limited degree without totally eliminating the need for extra buffering and speed reduction due to bursts in packet arrivals at the network device.

A need therefore exists for an improved method and system for updating network flow statistics for a network device gathered by a processor and stored in a memory device external to the processor. Accordingly, a solution that addresses, at least in part, the above and other shortcomings is desired.

SUMMARY OF THE INVENTION

According to one aspect of the invention, there is provided a method for updating a current network flow statistic stored in a memory device, comprising: storing a first statistic and a first address corresponding to a location in the memory device in a first stage of a multiple stage delay pipeline; shifting the first statistic and the first address to successive stages of the pipeline during successive clock cycles; at a middle stage of the pipeline, sending a read signal to the memory device to read the current statistic from the location; at a last stage of the pipeline, receiving the current statistic from the memory device in response to the read signal, adding the first statistic to the current statistic to generate an updated statistic, and sending a write signal to the memory device to write the updated statistic to the location; and, if a second statistic for the first address is stored in the first stage of the pipeline while the first statistic is stored in any but the first and last stages of the pipeline, replacing the first statistic with a sum of the first and second statistics and not sending the read signal when the second statistic is shifted to the middle stage.

In the above method, the middle stage may be one of a number of middle stages between the first and last stages and the number of middle stages may be equal to one for the middle stage plus a number of clock cycles of delay for reading statistics stored in the memory device. The middle stage may have a stage number equal to the number of clock cycles of delay. The number of clock cycles of delay may be three. The method may further include determining the number of clock cycles of delay. The method may further include comparing an address stored in the first stage of the pipeline to addresses stored in all but the first and last stages of the pipeline to determine if the second statistic for the first address is stored in the first stage of the pipeline while the first statistic is stored in any but the first and last stages of the pipeline. The statistic may be one of a number of packets and a number of bytes of data. The pipeline may be implemented by a system. The memory device may be external to the system. And, the system may be one of a field programmable gate array ("FPGA") and an application-specific integrated circuit ("ASIC") and the memory device may be one of a reduced latency dynamic random access memory ("RLDRAM") device and a quad data rate ("QDR") synchronous random access memory ("SRAM") device.

In accordance with further aspects of the present invention there is provided an apparatus such as a data processing system, a method for adapting this system, as well as articles of manufacture such as a computer readable medium having program instructions recorded thereon for practicing the method of the invention.

BRIEF DESCRIPTION OF THE DRAWINGS

Further features and advantages of the embodiments of the present invention will become apparent from the following detailed description, taken in combination with the appended drawings, in which.

It will be noted that throughout the appended drawings, like features are identified by like reference numerals.

DETAILED DESCRIPTION OF THE PREFERRED EMBODIMENTS

In the following description, details are set forth to provide an understanding of the invention. In some instances, certain software, circuits, structures and techniques have not been described or shown in detail in order not to obscure the invention. The term "data processing system" is used herein to refer to any machine for processing data. The present invention may be implemented in any computer programming language provided that the operating system of the data processing system provides the facilities that may support the requirements of the present invention. Any limitations presented would be a result of a particular type of operating system or computer programming language and would not be a limitation of the present invention. The present invention may also be implemented in hardware.

The present invention addresses problems caused by long access delays when accessing external memories for flow based statistics collection. As will be described below, the present invention uses a match pipeline which aggregates multiple memory accesses into a single memory access. This allows faster throughput, reduced power consumption, and eliminates additional storage requirements for statistic update operations. The present invention may be applied in network devices, general data processing systems, and consumer products.

Figure 1:
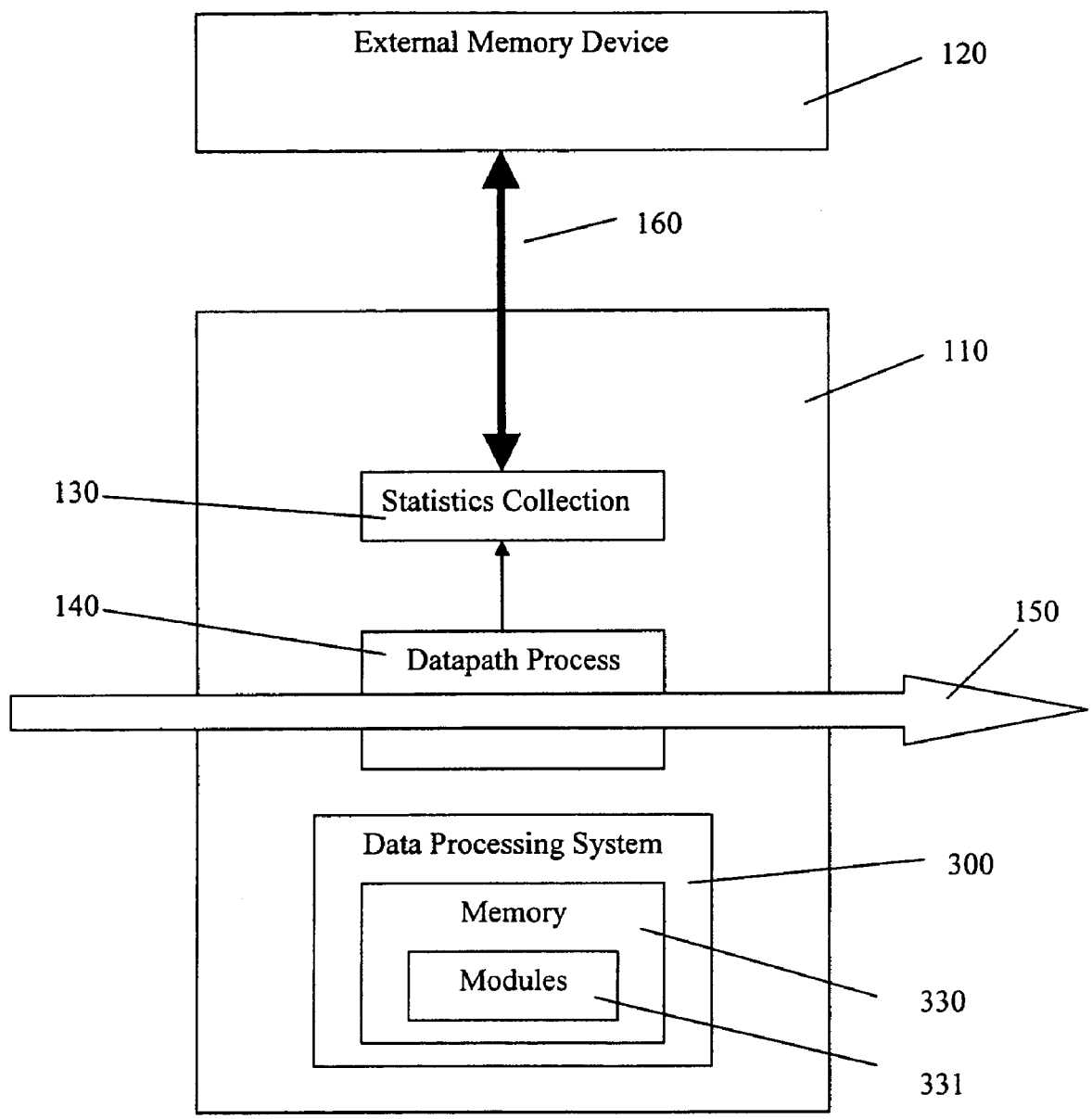
FIG. 1 is a block diagram illustrating a statistics system within a network device in accordance with an embodiment of the invention.

FIG. 1 is a block diagram illustrating a statistics system 100 within a network device (not shown) in accordance with an embodiment of the invention. The statistics system 100 includes an integrated circuit ("IC") 110 coupled to an external memory device 120 over an interface 160. The IC 110 may be a field programmable gate array ("FPGA") and the external memory device 120 may be a quad data rate ("QDR") synchronous RAM ("SRAM") device or a reduced latency dynamic random access memory ("RLDRAM") device. The network device receives a data flow 150 such as a flow of packets (e.g., Internet Protocol ("IP") based packets). The IC 110 includes a datapath process module 140 for monitoring the data flow 150 which is coupled to a statistics collection module 130 for generating statistics relating to the data flow 150. The IC 110 is coupled by an interface 160 to the external memory device 120 where the statistics are stored. In accordance with the present invention, the statistics system 100 includes a data processing system 300 for updating statistics stored in the external memory 120. As will be described in more detail below, the data processing system 300 reads statistics from the external memory device 120 and writes updated statistics to the external memory device 120. The data processing system 300 may be implemented within the IC 110 (e.g., within the statistics collection module 130) or external to it. In FIG. 1, the data processing system 300 is shown within the IC 110.

The data processing system 300 may be implemented as a state machine, software module(s), hardware module(s), and/or a group of registers, etc., either within or outside of the IC 110. If implemented as a stand-alone system, the data processing system 300 may include a central processing unit ("CPU") (not shown), memory 330, and an interface device (not shown). The CPU may include dedicated coprocessors and memory devices. The memory 330 may include RAM, ROM, disk devices, and databases. And, the interface device may include a bus, serial, or network connection. The system 300 is adapted for communicating with other data processing systems (e.g., 110, 120) over a bus, serial, or network connection via its interface device. The CPU of the system 300 is operatively coupled to memory 330 which may store an operating system (not shown) for general management of the system 300. The system 300 has stored therein data representing sequences of instructions which when executed cause the method described herein to be performed. Of course, the system 300 may contain additional software and hardware a description of which is not necessary for understanding the invention.

Thus, the data processing system 300 includes computer executable programmed instructions for directing the system 300 to implement the embodiments of the present invention. The programmed instructions may be embodied in one or more hardware modules or software modules 331 resident in the memory 330 of the system 300. Alternatively, the programmed instructions may be embodied on a computer readable medium (such as a CD disk or floppy disk) which may be used for transporting the programmed instructions to the memory 330 of the system 300. Alternatively, the programmed instructions may be embedded in a computer-readable signal or signal-bearing medium that is uploaded to a network by a vendor or supplier of the programmed instructions, and this signal or signal-bearing medium may be downloaded through an interface to the system 300 from the network by end users or potential buyers.

Figure 2:
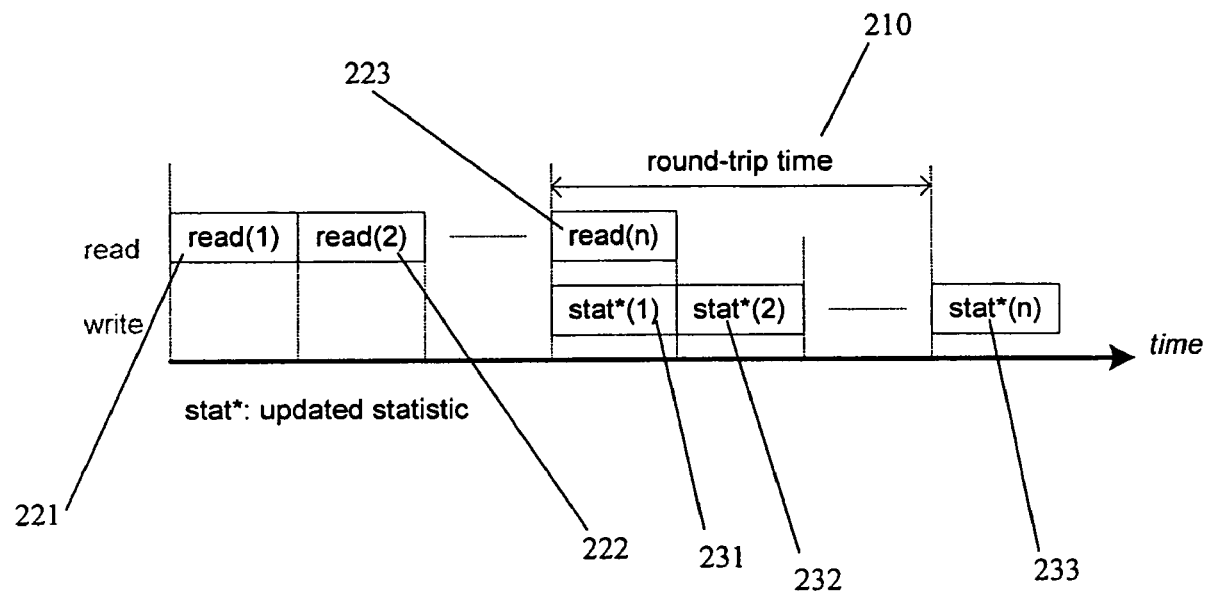
FIG. 2 is a time line illustrating round trip delay for a statistics update operation in accordance with an embodiment of the invention.

FIG. 2 is a time line illustrating round-trip delay 210 for a statistics update operation in accordance with an embodiment of the invention. The time line shows the timing for sequential read signals 221, 222, 223 sent from the IC 110 to the external memory device 120 and corresponding statistic signals 231, 232, 233 returned from the external memory device 120 to the IC 110. Thus, a read signal (e.g., 221) is sent by the IC 110 to read a statistic from the external memory 120. In return, a statistic signal (e.g., 231) is sent by the external memory device 120 to the IC 110. In FIG. 2, the round trip-delay 210 is shown as being approximately the number of cycles (e.g., 3) between the "read(n)" read signal 223 and the "stat*(n)" statistic signal 233, that is, the period from read signal 223 to corresponding statistic signal 233. As mentioned above, the total round-trip delay 210 (i.e., the time to read from a location in memory including internal synchronization) is a serious bottleneck in maintaining per-flow statistics at the rate of packet arrival at the network device. In order to speed up memory access for statistic updates, simple pipeline techniques can provide a partial solution. However, a limitation of simple pipeline techniques is apparent when multiple updates for a particular flow are required for a period of time that is shorter than the round-trip delay 210. In such a case, each statistic update requires the previous update to have been completed. The present invention overcomes these limitations by providing a delay pipeline having an entry match design that aggregates multiple accesses into a single access.

Figure 3:
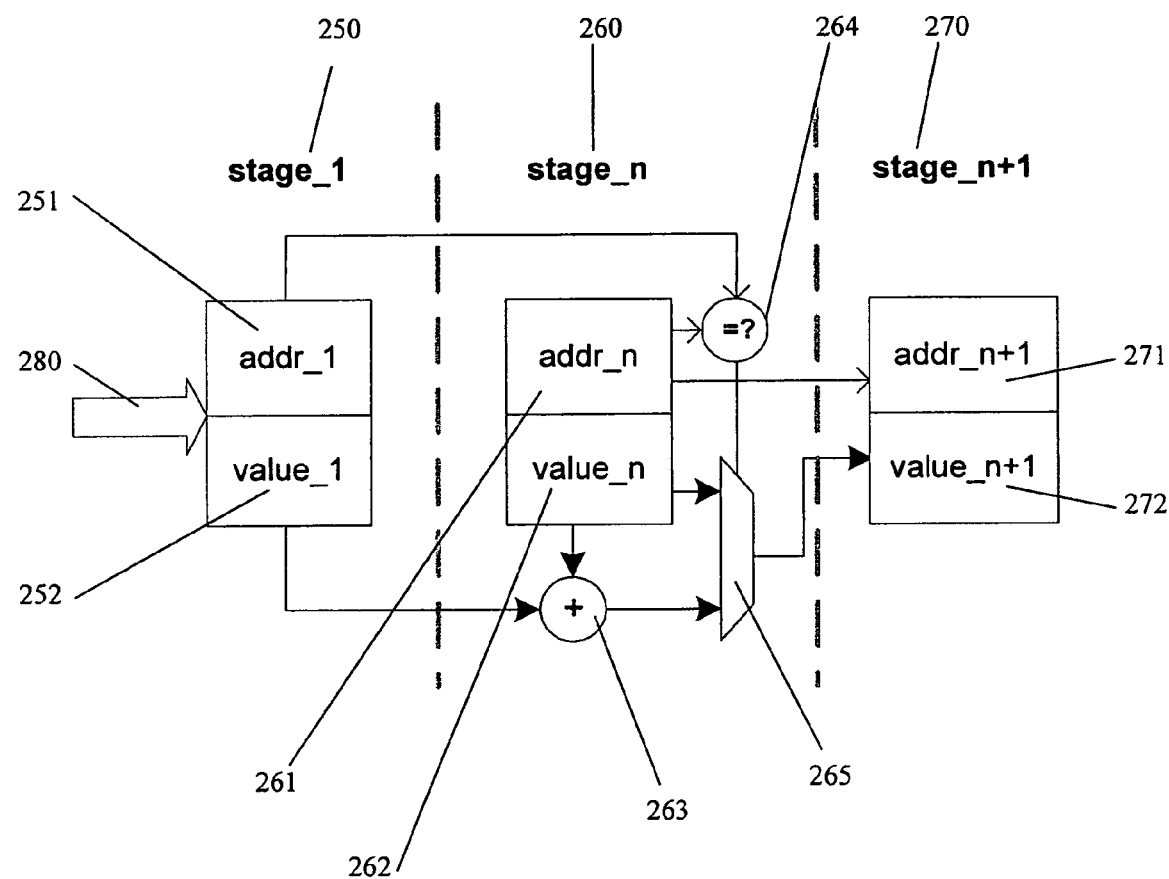
FIG. 3 is a block diagram illustrating a simplified delay pipeline for updating statistics in a statistics system in accordance with an embodiment of the invention.

FIG. 3 is a block diagram illustrating a simplified delay pipeline 200 for updating statistics in a statistics system 100 in accordance with an embodiment of the invention. The delay pipeline 200 of FIG. 3 shows three stages, namely, stage_1 250, stage_n 260, and stage_n+1 270. According to one embodiment, the delay pipeline 200 receives a memory access request 280 from the statistics collection module 130. The memory access request 280 has an address and a statistic value associated with it. The address specifies a location in the external memory device 120. The statistic value may be a number of packets, etc. Each stage 250, 260, 270 has an associated memory address 251, 261, 271, an associated statistic value 252, 262, 272, and a valid flag (not shown) which indicates if there is a valid request for access to the external memory device 120. The delay pipeline 200 may be implemented by the IC 110 and/or data processing system 300.

After a new access (e.g., 280) is placed in the delay pipeline 200, a read signal (or message) is launched to obtain a current statistic from the specified address in the external memory device 120. During the round-trip time, any duplicate access requests are eliminated, but their statistic values are merged (i.e., added) into the statistic value of the original access. When the current statistic arrives back from the external memory 120 (after the total round-trip time), an updated statistic value is calculated based on the current statistic value and the merged value for the new accesses.

The delay pipeline 200 is comprised of a predetermined number of stages that is based on the total round-trip delay 210. Each stage 250, 260, 270 contains three entries (or context): a valid flag (not shown) which indicates if the stage contains a valid access; an address 251, 261, 271 for a location in the external memory device 120 for the access; and, a value 252, 262, 272 by which the current statistic (i.e., in memory) is to be updated. The address and value are shifted from stage to stage upon successive clock signals or cycles. The successive clock signals may be generated by the IC 110 or by the data processing system 300.

Each new access 280 is entered into the first stage (e.g., stage_1 250) of the delay pipeline 200. The entry for each subsequent stage (e.g., 260) of the delay pipeline 200 is determined from the result of a search 264. The search 264 compares the address 251 at the first stage 250 to the address of each other stage 260 in the delay pipeline 200. This search 264 determines if there are multiple accesses in the delay pipeline 200 that are directed toward the same address or location in the external memory device 120. If the address addr_1 251 of stage_1 250 does not equal the addr_n 261 of stage_n 260, then the content 261, 262 of stage_n 260 is shifted to stage_n+1 270. If the address addr_1 251 of stage_1 250 equals the addr_n 261 of stage_n 260, then: the access at stage_1 250 is invalidated (i.e., the stage's valid flag is reset); the statistic value value_n+1 272 at stage_n+1 270 is calculated as the sum 263 of the statistic value value_1 252 of stage_1 250 and the statistic value value_n 262 of stage_n 260; and, the address addr_n 261 at stage_n 260 is shifted to the address addr_n+1 271 of stage_n+1 270. The result or output of the search comparator 264 is used to control a multiplexer 265 for selecting between the output of the adder 263 and the register or other device containing value_n 262 for stage_n 260.

Figure 4:
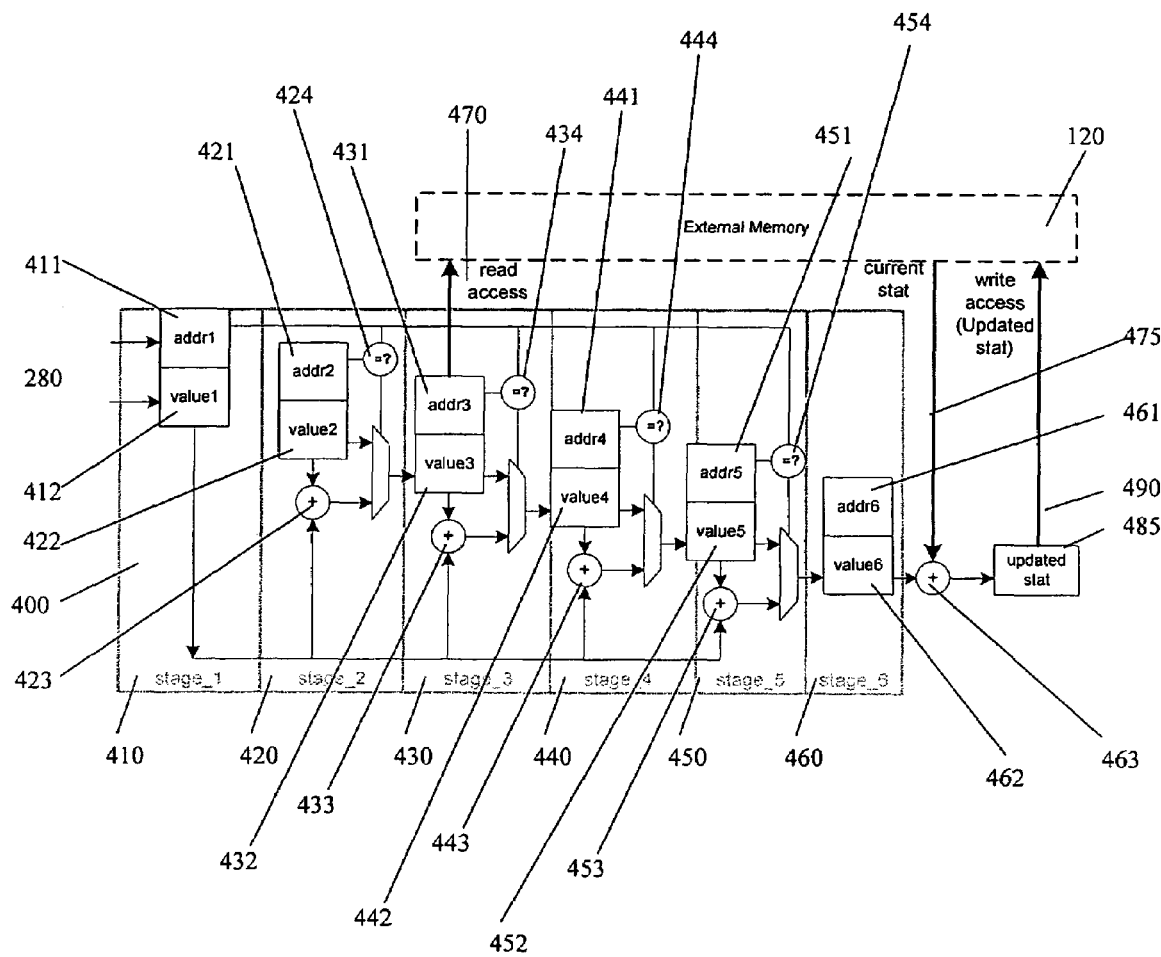
FIG. 4 is a block diagram illustrating a multiple stage delay pipeline for updating statistics in a quad data rate ("QDR") external memory device based statistics system in accordance with an embodiment of the invention.

FIG. 4 is a block diagram illustrating a multiple stage delay pipeline 400 for updating statistics in a quad data rate ("QDR") external memory device 120 based statistics system 100 in accordance with an embodiment of the invention. An analysis is first performed to determine the total round-trip delay for the memory interface 160. In this case the total round-trip delay is three (3) clock cycles including necessary conversions for interfacing to the QDR memory device 120. The delay pipeline 400 may be implemented by the IC 110 and/or data processing system 300.

The delay pipeline 400 has six stages 410, 420, 430, 440, 450, 460. Each stage 410, 420, 430, 440, 450, 460 contains three entries (or context): a valid flag (not shown) which indicates if the stage contains a valid access; an address 411, 421, 431, 441, 451, 461 for a location in the external memory device 120 for the access; and, a value 412, 422, 432, 442, 452, 462 by which the current statistic 475 (i.e., read from memory 120) is to be updated to provide an updated statistic 485.

Each new access 280 (i.e., an address "addr1" and statistic value "value1") is entered into the first stage 410, 411, 412 of the delay pipeline 400. The entry for each subsequent stage (i.e., 420, 430, 440, 450) of the delay pipeline 400 is determined from the result of a search 424, 434, 444, 454. The search 424, 434, 444, 454 compares the address 411 at the first stage 410 to the address 421, 431, 441, 451 of each other stage 420, 430, 440, 450 in the delay pipeline 400, except the last 460 stage. This search 424, 434, 444, 454 determines if there are multiple accesses in the delay pipeline 400 that are directed toward the same address or location in the external memory device 120.

If the address 411 of the first stage 410 does not equal the address 421, 431, 441, 451 of any of the second, third, fourth, or fifth stages 420, 430, 440, 450, then the content 411, 412 of the first stage 410 is shifted to the second stage 420. If the address 411 of the first stage 410 equals the address 421, 431, 441, 451 of any of second, third, fourth, or fifth stages 420, 430, 440, 450, say address 431 of the third stage 430, during an initial clock cycle (e.g., cycle 5 550 in FIG. 5) then, on the next clock cycle (e.g., cycle 6 560 in FIG. 5): the access at the second stage 420 is invalidated (i.e., the stage's valid flag is reset which is shown as a blank space 520 in FIG. 5); the statistic value 442 at the fourth stage 440 is calculated as the sum 433 of the statistic value 412 of the first stage 410 and the statistic value 432 of the third stage 243 (i.e., during cycle 5 550 in FIG. 5); and, the address 431 at the third stage 430 (i.e., during cycle 5 550 in FIG. 5) is shifted to the address 441 of the fourth stage 440 (i.e., during cycle 6 560 in FIG. 5).

As shown in FIG. 4, the read access or signal 470 is launched at the third stage 430 and the current statistic value (i.e., "current stat") 475 is returned from the external memory device 120 three cycles later. At the sixth stage 460, the current statistic value 475 is summed 463 with the statistic value 462 from the sixth stage 460 to generate an updated statistic value (i.e., "updated stat") 485 which is then written 490 to the external memory device 120.

Figure 5:
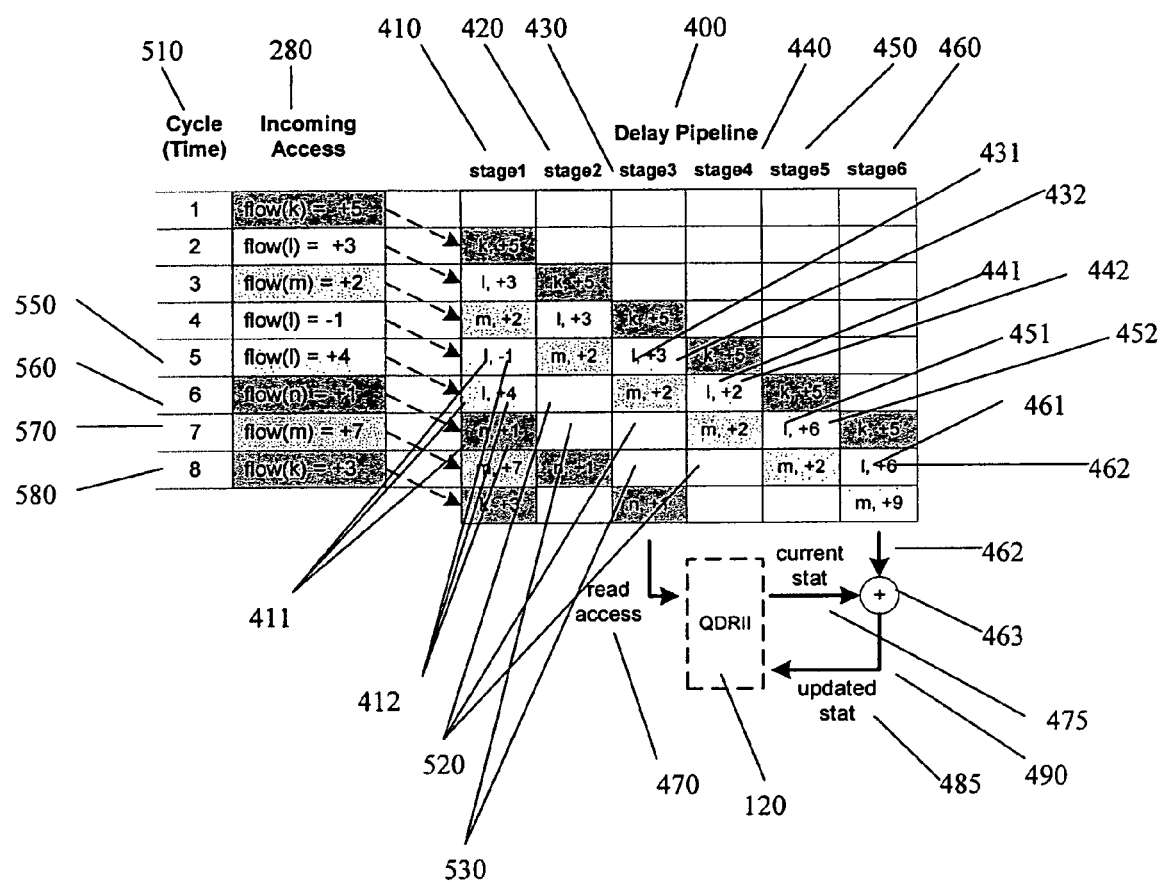
FIG. 5 is a timing diagram illustrating the state of the delay pipeline of FIG. 4 during successive clock cycles in accordance with an embodiment of the invention; and, FIG. 6 is a flow chart illustrating operations of modules within the memory of a system for updating a current network flow statistic stored in a memory device, in accordance with an embodiment of the invention.

FIG. 5 is a timing diagram illustrating the state of the delay pipeline 400 of FIG. 4 during successive clock cycles 510 in accordance with an embodiment of the invention. The status of the delay pipeline 400 during successive clock cycles 510 is represented by each row (e.g., 550, 560, 570, 580) in the timing diagram. In FIG. 5, addresses are represented by the letters "k", "l", "m", and "n". For example, address 411 has the value "l" during cycle 5 550. Each address may represent a storage location for a statistic relating to a respective data flow through the network device. In addition, statistic values are presented by integers such as "+5", "−1", etc., in FIG. 5. For example, value 412 has the value "−1" in during cycle 5 550.

Continuing with the above example, and referring to FIGS. 4 and 5, during cycle 5 550, address 411 equals "1" and value 412 equals "−1" (i.e., for the first stage 410) while address 431 equals "1" and value 432 equals "+3" (i.e., for the third stage 430). Thus, address 411 equals address 431. Therefore, during the next cycle 6 560, the access for the second stage 420 is flagged as invalid which is shown as a blank space 520 in FIG. 5. In addition, the value 442 for the fourth stage 440 is the sum 433 of the values 412 (i.e., "−1") and 432 (i.e., "+3") for the first and third stages 410, 430 from cycle 5 550 (i.e., value 442="−1"+"+3"="+2").

Continuing further with the above example, during cycle 6 560, address 411 equals "1" and value 412 equals "+4" (i.e., for the first stage 410) while address 441 equals "1" and value 442 equals "+2" (i.e., for the fourth stage 430). Thus, address 411 equals address 441. Therefore, during the next cycle 7 570, the access for the second stage 420 is flagged as invalid which is shown as a blank space 530 in FIG. 5. In addition, the value 452 for the fifth stage 450 is the sum 443 of the values 412 (i.e., "+2") and 442 (i.e., "+4") for the first and fourth stages 410, 440 from cycle 6 560 (i.e., value 452="+2"+"+4"="+6").

Continuing further with the above example, during cycle 7 570, address 411 equals "n" and value 412 equals "+1" (i.e., for the first stage 410). Thus, address 411 does not equal any other address 421, 431, 441, 451 within the delay pipeline 400 (excluding the last stage 461). Therefore, during the next cycle 8 580, the address 451 (i.e., "1") and value 452 (i.e., "+6") from the fifth stage 450 are shifted to the sixth stage 460. The address 461 and value 462 for the sixth stage 460 are thus "1" and "+6", respectively, during cycle 8 580.

Continuing further with the above example, during cycle 8 580, for address "1", the value 462 (i.e., "+6") from the sixth stage 460 is added 463 to the current statistic value 475 (say "+5") that was returned from the memory device 120 in response to the read signal 470 that was launched at the third stage 430 (i.e., during cycle 5 550 for address "1") to generate an updated statistic value 485 (e.g., "+6"+"+5"="+11") which is then written 490 to the external memory device 120.

To reiterate, any new accesses are placed in the first stage 410. The second stage 420 is updated by shifting the content of the first stage 410 to the second stage 420. The access for the second stage 420 is invalidated if there is a match in address between the first stage 410 and the remaining stages 420, 430, 440, 450 (except for last stage 460). The address for the third stage 430 is updated with the address from the second stage 420. The statistic for the third stage 430 is updated with the statistic from the second stage 420 if the addresses of the first and second stages 420, 430 do not match. The statistic for the third stage 430 is updated with the sum of the statistics for the first and second stages 410, 420 if the addresses of the first and second stages 410, 420 do match. In this case, the access for the second stage 420 is invalidated. Recall that every stage has a valid flag and that, for the present example, read accesses or signals are launched from the third stage 430 only if the valid flag is asserted or set. By invalidating the access, duplicate reads to the same address are prevented which reduces latencies. Similarly, the address for the fourth stage 440 is updated with the address from the third stage 430. The statistic for the fourth stage 440 is updated with the statistic from the third stage 430 if the addresses of the first and third stages 410, 430 do not match. The statistic for the fourth stage 440 is updated with the sum of the statistics for the first and third stages 410, 430 if the addresses for the first and third stages 410, 430 match and, again, the access for the first stage 410 is invalidated. All remaining stages, except for the last stage 460 are updated similarly.

Thus, the present invention provides a method and system for at-speed (i.e., at the speed or rate of the packet arrival in a data flow 150) statistics collection using external memory devices 120. The invention provides a delay pipeline 200, 400 that allows for the aggregation of multiple accesses (e.g., "+3", "−1", "+4") into a single access (e.g., "+6") for a specific address (e.g., "1") in order to avoid latencies that are caused by the total round-trip delays of external memory devices 120. The length or number of stages of the delay pipeline 200, 400 is dependent on the round-trip delay. The method may be implemented by a FPGA or an application-specific integrated circuit ("ASIC") 110 for use with QDR or RLDRAM memory devices 120. For example, with the present invention, packet/byte counts can be updated at every clock cycle or with the arrival of back-to-back short packets, etc.

The invention provides several advantages. For example, it provides for faster throughput, reduced power consumption, and reduced storage requirements for per-flow statistics collection using external memory devices 120. Designs that require at-speed statistics collection may be modified to take advantage of the present invention. For example, designs that include FPGAs or ASICs 110 and that perform statistics collection using external memory devices 120 such as QDR, RLDRAM, etc. Typically, these memory devices have round-trip delays that are multiple clock cycles (e.g., 3 cycles) in duration.

Figure 6:
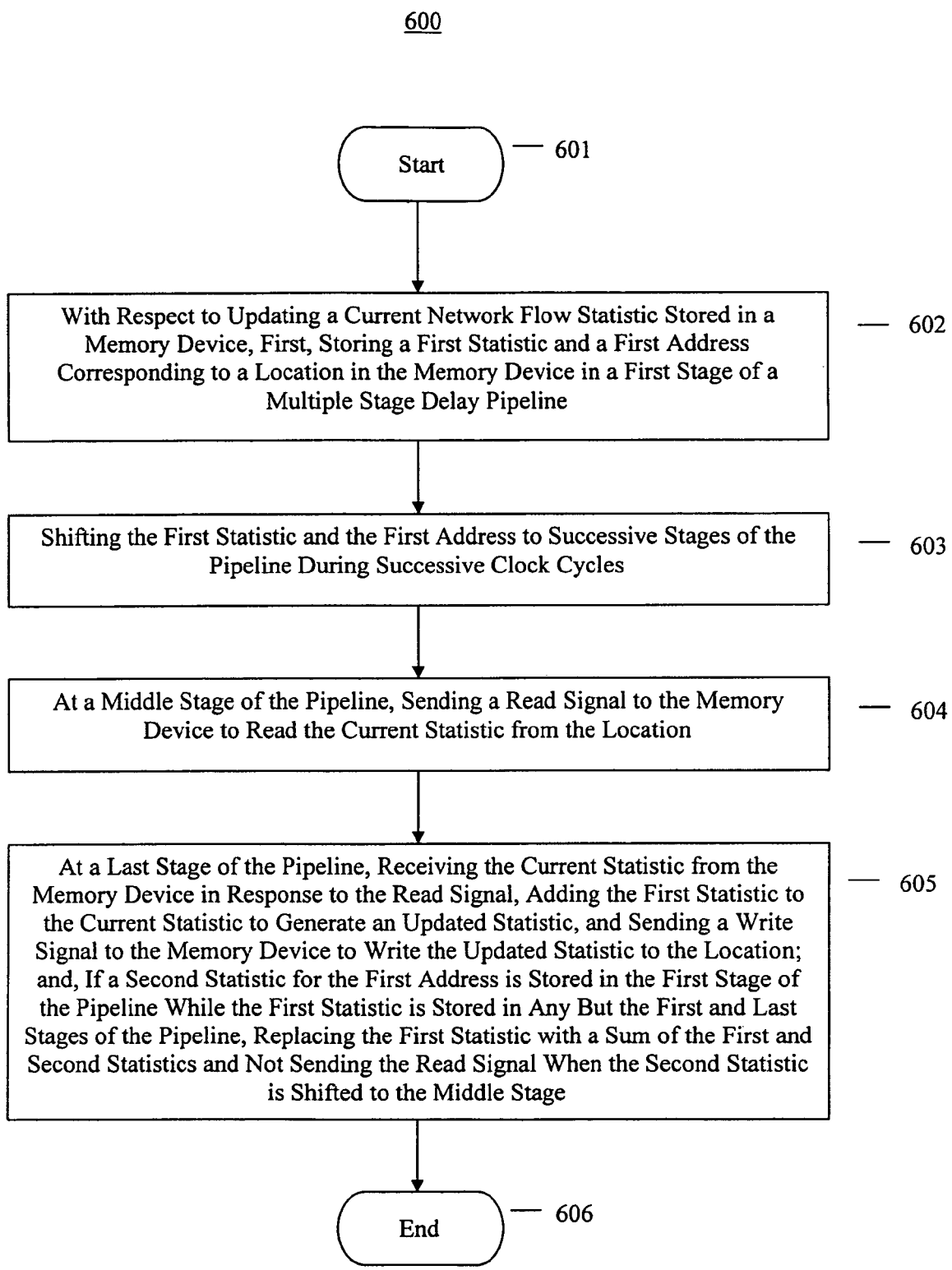

The above described method (i.e., with respect to FIGS. 4 and 5) may be summarized with the aid of a flowchart. FIG. 6 is a flow chart illustrating operations 600 of modules 331 within the memory 330 of a system (e.g., 100, 110, 300) for updating a current network flow statistic 475 stored in a memory device 120, in accordance with an embodiment of the invention.

At step 601, the operations 600 start.

At step 602, a first statistic (e.g., "+3") and a first address (e.g., "1") corresponding to a location in the memory device 120 are stored in a first stage 410, 411, 412 of a multiple stage delay pipeline 400.

At step 603, the first statistic (i.e., "+3") and the first address (i.e., "1") are shifted to successive stages (e.g., 420, 430, 440, 450, 460) of the pipeline during successive clock cycles 510 (e.g., 550, 560, 570, 580).

At step 604, at a middle stage 430 of the pipeline 400, a read signal 470 is sent to the memory device 120 to read the current statistic 475 from the location.

At step 605, at a last stage 460 of the pipeline 400, the current statistic 475 is received from the memory device 120 in response to the read signal 470, the first statistic (i.e., "+6") is added to the current statistic 475 (i.e., "+5") to generate an updated statistic 485 (i.e., "+6"+"+5"="+11"), and a write signal 490 is sent to the memory device 120 to write the updated statistic 485 to the location. If a second statistic (e.g., "−1", "+4") for the first address (e.g., "1") is stored in the first stage 410, 411, 412 of the pipeline 400 while the first statistic (i.e., "+3") is stored in any but the first and last stages 410, 460 of the pipeline 400, the first statistic (i.e., "+3") is replaced with a sum (i.e., "+2", "+6") of the first and second statistics (i.e., "+3" and "−1", "+2" and "+4") and the read signal 470 is not sent 520, 530 when the second statistic (i.e., "−1", "+4") is shifted to the middle stage 430.

At step 606, the operations 600 end.

In the above method, the middle stage 430 may be one of a number of middle stages 420, 430, 440, 450 between the first 410 and last 460 stages and the number of middle stages may be equal to one for the middle stage 430 plus a number of clock cycles of delay (e.g., 3) for reading statistics stored in the memory device 120. The middle stage 430 may have a stage number equal to the number of clock cycles of delay (e.g., 3). The number of clock cycles of delay may be three. The method may further include determining the number of clock cycles of delay (i.e., 3). The method may further include comparing an address (i.e., "1") stored in the first stage 410 of the pipeline 400 to addresses (e.g., "m", "l", "k") stored in all 420, 430, 440, 450 but the first 410 and last 460 stages of the pipeline 400 to determine if the second statistic (e.g., "−1", "+4") for the first address (e.g., "1") is stored in the first stage 410 of the pipeline 400 while the first statistic (e.g., "+3") is stored in any 420, 430, 440, 450 but the first 410 and last 460 stages of the pipeline 400. The statistic may be one of a number of packets and a number of bytes of data. The pipeline 400 may be implemented by a system 110, 300. The memory device 120 may be external to the system 110, 300. And, the system 110, 300 may be one of a field programmable gate array ("FPGA") and an application-specific integrated circuit ("ASIC") and the memory device 120 may be one of a reduced latency dynamic random access memory ("RLDRAM") device and a quad data rate ("QDR") synchronous random access memory ("SRAM") device.

While this invention is primarily discussed as a method, a person of ordinary skill in the art will understand that the apparatus discussed above with reference to a data processing system 300, may be programmed to enable the practice of the method of the invention. Moreover, an article of manufacture for use with a system 300, such as a pre-recorded storage device or other similar computer readable medium including program instructions recorded thereon, may direct the system 300 to facilitate the practice of the method of the invention. It is understood that such apparatus and articles of manufacture also come within the scope of the invention.

In particular, the sequences of instructions which when executed cause the method described herein to be performed by the data processing system 300 of FIG. 1 can be contained in a data carrier product according to one embodiment of the invention. This data carrier product can be loaded into and run by the system 300 of FIG. 1. In addition, the sequences of instructions which when executed cause the method described herein to be performed by the system 300 of FIG. 1 can be contained in a computer software product according to one embodiment of the invention. This computer software product can be loaded into and run by the system 300 of FIG. 1. Moreover, the sequences of instructions which when executed cause the method described herein to be performed by the system 300 of FIG. 1 can be contained in an integrated circuit product (e.g., hardware modules) including a coprocessor or memory according to one embodiment of the invention. This integrated circuit product can be installed in the system 300 of FIG. 1.

The embodiments of the invention described above are intended to be exemplary only. Those skilled in this art will understand that various modifications of detail may be made to these embodiments, all of which come within the scope of the invention.

What is claimed is:

1. A method for updating a current network flow statistic stored in a memory device, comprising:
   storing a first statistic and a first address corresponding to a location in the memory device in a first stage of a multiple stage delay pipeline;
   shifting the first statistic and the first address to successive stages of the pipeline during successive clock cycles;
   at a middle stage of the pipeline, sending a read signal to the memory device to read a current statistic from the location;
   at a last stage of the pipeline, receiving the current statistic from the memory device in response to the read signal, adding the first statistic to the current statistic to generate an updated statistic, and sending a write signal to the memory device to write the updated statistic to the location; and,
   if a second statistic for the first address is stored in the first stage of the pipeline while the first statistic is stored in any but the first and last stages of the pipeline, replacing the first statistic with a sum of the first and second statistics and not sending the read signal when the second statistic is shifted to the middle stage.

2. The method of claim 1 wherein the middle stage is one of a number of middle stages between the first and last stages and wherein the number of middle stages is equal to one for the middle stage plus a number of clock cycles of delay for reading statistics stored in the memory device.

3. The method of claim 2 wherein the middle stage has a stage number equal to the number of clock cycles of delay.

4. The method of claim 3 wherein the number of clock cycles of delay is three.

5. The method of claim 2 and further comprising determining the number of clock cycles of delay.

6. The method of claim 1 and further comprising comparing an address stored in the first stage of the pipeline to addresses stored in all but the first and last stages of the pipeline to determine if the second statistic for the first address is stored in the first stage of the pipeline while the first statistic is stored in any but the first and last stages of the pipeline.

7. The method of claim 1 wherein the statistic is one of a number of packets and a number of bytes of data.

8. The method of claim 1 wherein the pipeline is implemented by a system.

9. The method of claim 8 wherein the memory device is external to the system.

10. The method of claim 9 wherein the system is one of a field programmable gate array ("FPGA") and an application-specific integrated circuit ("ASIC") and wherein the memory device is one of a reduced latency dynamic random access memory ("RLDRAM") device and a quad data rate ("QDR") synchronous random access memory ("SRAM") device.

11. A system for updating a current network flow statistic stored in a memory device, comprising:
   a processor coupled to memory; and,
   modules within the memory and executed by the processor, the modules including:
   a module for storing a first statistic and a first address corresponding to a location in the memory device in a first stage of a multiple stage delay pipeline;
   a module for shifting the first statistic and the first address to successive stages of the pipeline during successive clock cycles;
   a module for, at a middle stage of the pipeline, sending a read signal to the memory device to read a current statistic from the location;
   a module for, at a last stage of the pipeline, receiving the current statistic from the memory device in response to the read signal, adding the first statistic to the current statistic to generate an updated statistic, and sending a write signal to the memory device to write the updated statistic to the location; and,
   a module for, if a second statistic for the first address is stored in the first stage of the pipeline while the first statistic is stored in any but the first and last stages of the pipeline, replacing the first statistic with a sum of the first and second statistics and not sending the read signal when the second statistic is shifted to the middle stage.

12. The system of claim 11 wherein the middle stage is one of a number of middle stages between the first and last stages and wherein the number of middle stages is equal to one for the middle stage plus a number of clock cycles of delay for reading statistics stored in the memory device.

13. The system of claim 12 wherein the middle stage has a stage number equal to the number of clock cycles of delay.

14. The system of claim 13 wherein the number of clock cycles of delay is three.

15. The system of claim 12 and further comprising a module for determining the number of clock cycles of delay.

16. The system of claim 11 and further comprising a module for comparing an address stored in the first stage of the pipeline to addresses stored in all but the first and last stages of the pipeline to determine if the second statistic for the first address is stored in the first stage of the pipeline while the first statistic is stored in any but the first and last stages of the pipeline.

17. The system of claim 11 wherein the statistic is one of a number of packets and a number of bytes of data.

18. The system of claim 11 wherein the memory device is external to the system.

19. The system of claim 18 wherein the system is one of a field programmable gate array ("FPGA") and an application-specific integrated circuit ("ASIC") and wherein the memory device is one of a reduced latency dynamic random access memory ("RLDRAM") device and a quad data rate ("QDR") synchronous random access memory ("SRAM") device.

* * * * *

UNITED STATES PATENT AND TRADEMARK OFFICE
CERTIFICATE OF CORRECTION

PATENT NO. : 7,634,631 B2 Page 1 of 1
APPLICATION NO. : 11/482706
DATED : December 15, 2009
INVENTOR(S) : Hayrettin Buyuktepe It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 994 days.

Signed and Sealed this

Twenty-first Day of December, 2010

David J. Kappos
*Director of the United States Patent and Trademark Office*